United States Patent
Dehon et al.

(10) Patent No.: US 7,242,601 B2
(45) Date of Patent: Jul. 10, 2007

(54) DETERMINISTIC ADDRESSING OF NANOSCALE DEVICES ASSEMBLED AT SUBLITHOGRAPHIC PITCHES

(75) Inventors: André Dehon, Pasadena, CA (US); Helia Naeimi, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 198 days.

(21) Appl. No.: 10/853,907

(22) Filed: May 25, 2004

(65) Prior Publication Data
US 2007/0127280 A1 Jun. 7, 2007

Related U.S. Application Data

(60) Provisional application No. 60/553,865, filed on Mar. 17, 2004, provisional application No. 60/530,001, filed on Dec. 16, 2003, provisional application No. 60/517,335, filed on Nov. 3, 2003, provisional application No. 60/475,171, filed on Jun. 2, 2003.

(51) Int. Cl.
*G11C 6/06* (2006.01)
*G11C 7/00* (2006.01)

(52) U.S. Cl. ............ 365/63; 365/51; 365/230.06; 977/963

(58) Field of Classification Search ............ 365/63, 365/51, 230.06; 977/963
See application file for complete search history.

(56) References Cited

U.S. PATENT DOCUMENTS

| | | | |
|---|---|---|---|
| 5,349,558 A | 9/1994 | Cleveland et al. | 365/200 |
| 6,128,214 A | 10/2000 | Kuekes et al. | 364/151 |
| 6,256,767 B1* | 7/2001 | Kuekes et al. | 716/9 |
| 6,314,019 B1 | 11/2001 | Kuekes et al. | 365/151 |
| 6,383,784 B1 | 5/2002 | Smith | 435/91.2 |
| 6,473,351 B2 | 10/2002 | Tomanek et al. | 365/215 |
| 6,777,982 B2 | 8/2004 | Goldstein et al. | 326/134 |
| 2002/0027819 A1 | 3/2002 | Tomanek et al. | 365/215 |
| 2002/0175390 A1* | 11/2002 | Goldstein et al. | 257/481 |
| 2003/0089899 A1 | 5/2003 | Lieber et al. | 257/9 |
| 2003/0200521 A1 | 10/2003 | DeHon et al. | 716/16 |
| 2003/0206436 A1 | 11/2003 | Eaton, Jr. et al. | 365/177 |
| 2004/0113138 A1 | 6/2004 | DeHon et al. | 257/9 |
| 2004/0113139 A1 | 6/2004 | Dehon et al. | 257/9 |

FOREIGN PATENT DOCUMENTS

WO 02/103753 A2 12/2002

(Continued)

OTHER PUBLICATIONS

U.S. Appl. No. 10/856,115, filed May 28, 2004, DeHon et al.

(Continued)

*Primary Examiner*—Son Dinh
(74) *Attorney, Agent, or Firm*—Ladas & Parry LLP

(57) ABSTRACT

A method for constructing and addressing a nanoscale memory with known addresses and for tolerating defects which may arise during manufacture or device operational lifetime. During construction, nanoscale wires with addresses are stochastically assembled. During a programming phase, nanoscale wires are stochastically selected using their stochastic addresses through microscale inputs and a desired address code is associated with the selected nanoscale wires. Memory addresses are associated to the codes and then selected using the known codes during read/write operations from/to the memory.

37 Claims, 12 Drawing Sheets

FOREIGN PATENT DOCUMENTS

| WO | 03/063208 A2 | 7/2003 |
| WO | 2004/034467 A2 | 4/2004 |
| WO | 2004/061859 A2 | 7/2004 |

OTHER PUBLICATIONS

U.S. Appl. No. 10/925,863, filed Aug. 24, 2004, DeHon.

Albrecht, O., et al., "Construction and Use of LB Deposition Machines for Pilot Production," *Thin Solid Films*, vol. 284-285, pp. 152-156 (Sep. 15, 1996).

Björk, M.T., et al., "One-Dimensional Steeplechase for Electrons Realized," *Nano Letters*, vol. 2, No. 2, pp. 87-89 (2002).

Brown, C.L., et al., "Introduction of [2]Catenases Into Langmuir Films and Langmuir-Blodgett Multilayers. A Possible Strategy for Molecular Information Storage Materials," *Langmuir*, vol. 16, No. 4, pp. 1924-1930 (2000).

Chen, Y., et al., "Nanoscale Molecular-Switch Crossbar Circuits," *Institute of Physics Publishing*, Nanotechnology 14, pp. 462-468 (2003).

Chen, Y., et al., "Self-Assembled Growth of Epitaxial Erbium Disilicide Nanowires on Silicon (001)," *Applied Physics Letters*, vol. 76, No. 2, pp. 4004-4006 (Jun. 26, 2000).

Chou, S.Y., "Sub-10 nm Imprint Lithography and Applications," *J. Vac. Sci. Technol. B*, vol. 15, No. 6, pp. 2897-2904 (Nov./Dec. 1997).

Collier, C.P., et al., "A [2]Catenane-Based Solid State Electronically Reconfigurable Switch," *Science*, vol. 289, pp. 1172-1175 (Aug. 18, 2000).

Collier, C.P., et al., "Electronically Configurable Molecular-Based Logic Gates," *Science*, vol. 285, pp. 391-394 (Jul. 16, 1999).

Cui, Y., et al., "Diameter-Controlled Synthesis of Single-Crystal Silicon Nanowires," *Applied Physics Letters*, vol. 78, No. 15, pp. 2214-2216 (Apr. 9, 2001).

Cui, Y., et al., "Doping and Electrical Transport in Silicon Nanowires," *The Journal of Physical Chemistry*, vol. 104, No. 22, pp. 5213-5216 (Jun. 8, 2000).

Cui, Y., et al., "Functional Nanoscale Electronic Devices Assembled Using Silicon Nanowire Building Blocks," *Science*, vol. 291, pp. 851-853 (Feb. 2, 2001).

Dekker, C., "Carbon Nanotubes As Molecular Quantum Wires," *Physics Today*, pp. 22-28 (May 1999).

Derycke, V., et al., "Carbon Nanotube Inter- and Intramolecular Logic Gates," *Nano Letters*, vol. 1, No. 9, pp. 453-456 (Sep. 2001).

Goldstein, S.C., et al., "NanoFabrics: Spatial Computing Using Molecular Electronics," *Proc. Of The 28th Annual International Symposium on Computer Architecture*, pp. 1-12 (Jun. 2001).

Gudiksen, M.S., et al. "Growth of Nanowire Superlattice Structures for Nanoscale Photonics and Electronics," *Nature*, vol. 415, pp. 617-620 (Feb. 7, 2002).

Huang, Y., et al., "Directed Assembly of One-Dimensional Nanostructures Into Functional Networks," *Science*, vol. 291, pp. 630-633 (Jan. 26, 2001).

Huang, Y., et al., "Logic Gates and Computation From Assembled Nanowire Building Blocks," *Science*, vol. 294, pp. 1313-1317 (Nov. 9, 2001).

Lauhon, L.J., et al., "Epitaxial Core-Shell and Core-Multishell Nanowire Heterostructures," *Nature*, vol. 420, pp. 57-61 (Nov. 7, 2002).

Lieber, C.M., "Nanowire Superlattices," *Nano Letters*, vol. 2, No. 2, pp. 81-82 (Feb. 2002).

Morales, A.M., et al., "A Laser Ablation Method for the Sythesis of Crystalline Semiconductor Nanowires," *Science*, vol. 279, pp. 208-211 (Jan. 9, 1998).

Tans, S.J., et al., "Room-Temperature Transitor Based on a Single Carbon Nanotube," *Nature*, vol. 393, pp. 49-52 (May 7, 1998).

Ulman, A., "Part Two: Langmuir-Blodgett Films," *An Introduction to Ultrathin Organic Films*, Section 2.1, pp. 101-132 (1991).

Whang, D., et al., "Nanolithography Using Hierarchically Assembled Nanowire Masks," *Nano Letters*, vol. 3, No. 7, pp. 951-954 (2003).

Wu, Y., et al., "Block-by-Block Growth of Single-Crystaline Si/SiGe Superlattice Nanowires," *Nano Letters*, vol. 2, No. 2, pp. 83-86 (2002).

International Written Opinion for the corresponding PCT Application No. PCT Application No. PCT/US03/01555, issued on Jun. 30, 2005 (7 pages).

Ziegler, M. M., et al., "CMOS/NANO Co-Design for Crossbar-based Molecular Electronics Systems" *IEEE Transactions on Nanotechnology*, vol. 2, No. 4, pp. 217-230 (Dec. 4, 2004).

DeHon, A., "Array Based Architecture for FET-Based Nanoscale Electronics", IEEE Transactions on Nanotechnology, vol. 2, No. 1, pp. 23-32 (Mar. 2003).

* cited by examiner

US 7,242,601 B2

DETERMINISTIC ADDRESSING OF NANOSCALE DEVICES ASSEMBLED AT SUBLITHOGRAPHIC PITCHES

CROSS REFERENCE TO RELATED APPLICATIONS

This application claims the benefit of U.S. provisional Patent Application Ser. No. 60/475,171, filed Jun. 2, 2003 for "Address Corrected, Sublithographic Memory Designs" by Andre' DeHon, U.S. Provisional Patent Application Ser. No. 60/517,335, filed Nov. 3, 2003 for "Address Corrected, Sublithographic Memory Designs" by Andre' DeHon, U.S. provisional Patent Application Ser. No. 60/530,001 filed Dec. 16, 2003 for "Deterministic Addressing of Nanoscale Devices Assembled at Sublithographic Pitches" by Andre' DeHon and Helia Naeimi, and U.S. provisional Patent Application Ser. No. 60/553,865, filed Mar. 17, 2004 for "Deterministic Addressing of Nanoscale Devices Assembled at Sublithographic Pitches" by Andre' DeHon, the disclosure of all of which is incorporated herein by reference. The subject matter of the present application may also be related to the following U.S. patent application(s): U.S. Ser. No. 10/627,405, filed on Jul. 24, 2003 (published as United States Patent Application Publication No. 2004/0113138 A1); U.S. Ser. No. 10/627,406, filed Jul. 24, 2003 (published as United States Patent Application Publication No. 2004/0113139 A1); U.S. Ser. No. 10/856,115, filed May 28, 2004; U.S. Ser. No. 10/347,121, filed Jan. 17, 2003 (published as U.S. Patent No. 2003/0200521); and U.S. Ser. No. 10/925,863, filed Aug. 24, 2004.

STATEMENT REGARDING FEDERALLY SPONSORED RESEARCH OR DEVELOPMENT

The present invention was made with support from the United States Government under Grant number N00014-01-0651 awarded by the Office of Naval Research of the Department of the Navy. The United States Government has certain rights in the invention.

BACKGROUND

1. Field

The present disclosure relates to the field of sublithographic fabrication of electronic circuits, in particular molecular electronics. More specifically, deterministic addressing of nanoscale devices assembled at sublithographic pitches is disclosed.

2. Related Art

Stochastic decoder assembly allows memories constructed on sublithographic-scale pitches to be addressed. See, for example, U.S. patent application Ser. No. 10/627,405. However, if the sublithographic arrays are to be used directly as memory, the random collection of addresses which index into each memory array is sometimes difficult to manage. This makes access slow, requiring the reading of thousands of bits in order to reliably find where each good bit is actually located in the array. A general disclosure of the related art can be found in PCT publication WO03/063208.

A diode programmable decoder is disclosed in Yong Chen et al., "Nanoscale Molecular-switch Crossbar Circuits", Institute of Physics Publishing, Nanotechnology 14 (2003), p. 462–468. However, such decoder cannot be built at nanoscale pitch. Additionally, it is difficult to use the decoder to put a strong voltage on the output of the decoder or to provide strong isolation of current on non-selected lines in the decoder.

SUMMARY

According to a first aspect, a method for addressing a memory is disclosed, comprising: selecting a nanoscale wire from a plurality of nanoscale wires through a first set of microscale inputs; associating a code to the selected nanoscale wire through a second set of microscale inputs; repeating the selecting and associating steps in accordance with a number of nanoscale wires to be programmed; associating memory addresses of the memory to codes associated with the selected nanoscale wires; and selecting memory addresses of the memory by means of the second set of microscale inputs.

According to a second aspect, an address selection method is disclosed, comprising: selecting a nanoscale wire from a plurality of nanoscale wires through a first set of microscale inputs; associating a code to the selected nanoscale wire through a second set of microscale inputs; repeating the selecting and associating steps in accordance with a number of addresses to be programmed; associating addresses to codes associated with the selected nanoscale wires; and selecting an address among the associated addresses by means of the second set of microscale inputs.

According to a third aspect, a memory addressing system is disclosed, comprising: a first stochastically assembled row decoder to select a first set of nanoscale wires through a first set of microscale inputs; a programmable row decoder to associate row addresses to the selected first set of nanoscale wires through a second set of microscale inputs; a first stochastically assembled column decoder to select a second set of nanoscale wires through a third set of microscale inputs; and a programmable column decoder to associate column addresses to the selected second set of nanoscale wires through a fourth set of microscale inputs.

According to a fourth aspect, a method for building a programmable FET decoder is disclosed, comprising: providing a first set of microscale wires; providing a set of stochastically assembled nanoscale wires; providing an isolation layer between the first set of microscale wires and the set of nanoscale wires, wherein the isolation layer and crosspoints between the first set of microscale wires and the set of nanoscale wires form the programmable FET decoder, each crosspoint being programmable by selection of a nanoscale wire from the set of stochastically assembled nanoscale wires and selection of one microscale wire from the first set of microscale wires.

According to a fifth aspect, a method for building a programmable decoder is provided, comprising: providing a first and second set of wires; providing a set of stochastically assembled nanoscale wires; and providing a plurality of diodes, each diode associated with a crosspoint between the second set of wires and the set of nanoscale wires, wherein the diodes are adapted to be programmed ON or OFF, each programmed ON diode establishing an electric connection between a wire of the second set of wires and a nanoscale wire of set of stochastically assembled nanoscale wires.

According to a sixth aspect, a method for building a programmable decoder, is disclosed, comprising: providing a first set of wires; providing a set of stochastically assembled nanoscale wires comprising axially distributed controllable regions; and providing a plurality of diodes, each diode associated with a crosspoint between the first set of wires and the set of nanoscale wires, wherein the diodes are adapted to be programmed ON or OFF, each programmed ON diode establishing an electric connection between a wire of the first set of wires and a nanoscale wire of set of stochastically assembled nanoscale wires.

According to a seventh aspect, a method of building a multiplexer is disclosed, comprising: forming input lines of the multiplexer by providing a plurality of nanoscale wires; and forming selection lines of the multiplexer by: providing a first set and a second set of microscale wires crossing the plurality of nanoscale wires, thus forming a first plurality of crosspoints and a second plurality of crosspoints between the nanoscale wires and the microscale wires; providing the nanoscale wires of the plurality of nanoscale wires with controllable regions in correspondence of the first plurality of crosspoints; selecting a nanoscale wire from the plurality of nanoscale wires by means of the first set of microscale wires; and programming the selected nanoscale wire by means of the second set of microscale wires, wherein selection of a particular output line among the input lines by means of the selection lines is made by selection of a particular signal to be sent through the second set of microscale wires.

According to an eighth aspect, a translation unit for nanoscale technology is disclosed, comprising: a plurality of nanoscale wires; a plurality of output wires intersecting the nanoscale wires; and a plurality of diodes connecting each nanoscale wire with the output wires, each diode being either in an ON condition or in an OFF condition, wherein, for a particular nanoscale wire, a pattern of ON diodes and OFF diodes connecting the particular nanoscale wire to the output wires is different from patterns of other nanoscale wires so that, when the particular nanoscale wire is selected among the plurality of nanoscale wires, information relating to the fact that the particular nanoscale wire has been selected is transferred to the output wires.

According to a ninth aspect, a signal translation method is disclosed, comprising: providing a plurality of nanoscale wires; providing a plurality of output wires intersecting the nanoscale wires; providing a plurality of ON-OFF devices connecting each nanoscale wire with the output wires; and for each nanoscale wire establishing a particular pattern of ON and OFF conditions of the ON-OFF devices so that, when the particular nanoscale wire is selected among the plurality of nanoscale wires, information relating to the fact that the particular nanoscale wire has been selected is transferred to the output wires.

According to a tenth aspect, a decoder for addressing a nanoscale memory is disclosed, comprising: a plurality of nanoscale wires, each nanoscale wire of the plurality of nanoscale wires corresponding to a nanoscale row or a nanoscale column of the nanoscale memory; and a plurality of selection wires intersecting the nanoscale wires, the selection wires adapted to select a nanoscale wire among the plurality of nanoscale wires, thus selecting a nanoscale row or a nanoscale column of the nanoscale memory.

According to an eleventh aspect, a method of building a multiplexer is provided, comprising: forming input lines of the multiplexer by providing a plurality of nanoscale wires; and forming selection lines of the multiplexer by: providing a set of control wires crossing the plurality of nanoscale wires, thus forming a plurality of crosspoints; and selecting a nanoscale wire from the plurality of nanoscale wires by means of the set of control wires, wherein selection of a particular output line among the input lines by means of the selection lines is made by selection of voltages applied to the control lines.

As a consequence, a more sophisticated memory is provided, which allows to program up the address mapping as part of the personalization. Once programmed, good memory bits live at deterministic addresses, allowing the memory to present a simpler interface to the outside world. Data can be accessed directly in a single read.

Throughout the present disclosure, the term microscale will refer to dimensions that range from about 0.1 micrometers to a about 2 micrometers in size. The term nanoscale will refer to dimensions that range from 0.1 nanometers to 50 nanometers (0.05 micrometers), the preferred range being from 0.5 nanometers to 5 nanometers.

BRIEF DESCRIPTION OF THE DRAWINGS

The present disclosure will be understood and appreciated more fully from the following detailed description taken in conjunction with the drawings in which.

DETAILED DESCRIPTION

Figure 1:
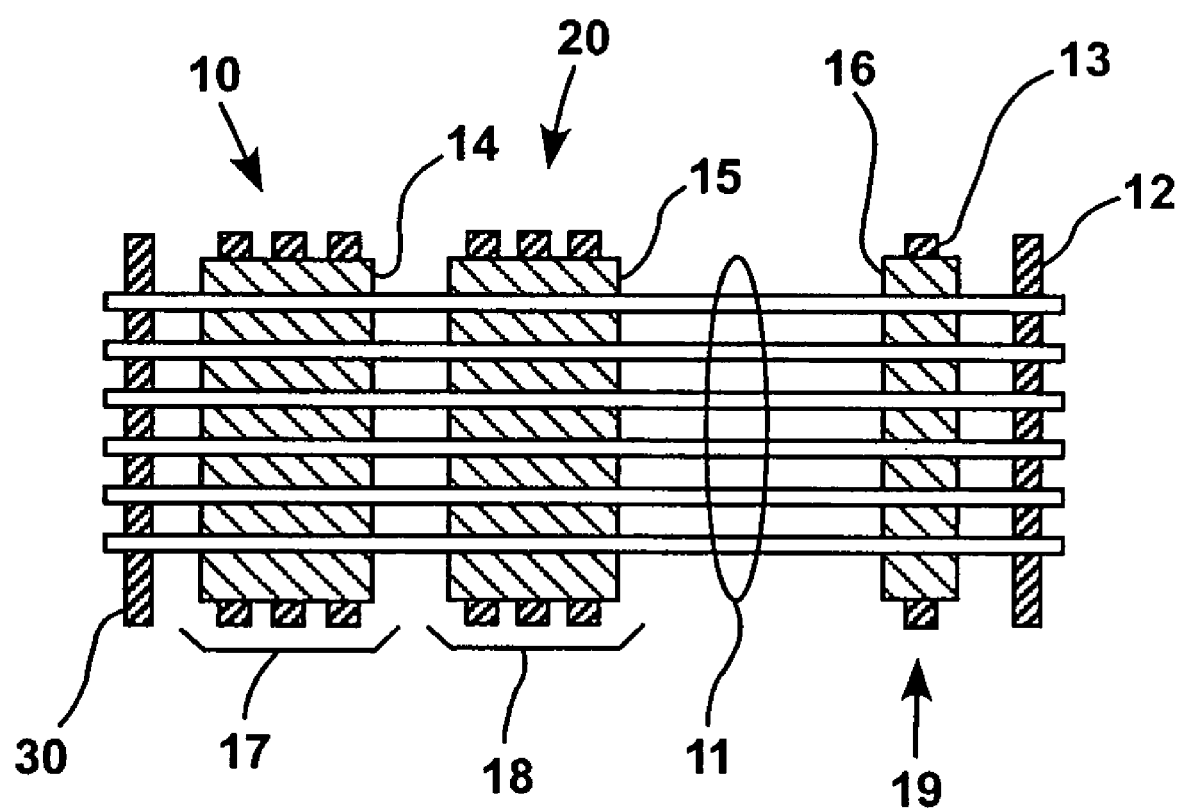
FIG. 1 shows a combination of a stochastic decoder with a deterministic decoder.

FIG. 1 shows a first address decoder 10 which allows one of the nanoscale wires 11 to be uniquely selected, together with a second, programmable, decoder 20. Together with the nanoscale wires 11, the first address decoder 10 comprises an oxide separation layer 14 and a first set of microscale wires 17. Similarly, the programmable decoder 20 comprises an oxide separation layer 15 and a second set of microscale wires 18. The first address decoder 10 is built using a stochastic decoder scheme to achieve unique addressability of the nanoscale wires. See, for example, U.S. patent application Ser. No. 10/627,405, which is incorporated herein by reference in its entirety.

In particular, a method of uniquely addressing a single nanoscale wire in a plurality of nanoscale wires comprises providing each nanoscale wire 11 with controllable regions axially distributed along the nanoscale wire, establishing a subset of nanoscale wires to be controlled by stochastically selecting the subset from the plurality of nanoscale wires, and selecting the single nanoscale wire among the subset of nanoscale wires by either controlling or not controlling the controllable regions on nanoscale wires of the subset of nanoscale wires. Preferably, the nanoscale wires are first mixed together to produce a random ordering of coded nanoscale wires and then assembled into sets of parallel wires; as a result, the set of nanoscale wires is selected stochastically.

Stochastic selection of coded nanoscale wires from a sufficiently large ensemble of such nanoscale wires ensures that almost all codes are unique. For example, a code space of $10^6$ different codes can be considered, where the number of wires having the same code is $10^6$, and the goal is that of building a small array with 10 wires in it. If each wire is selected from a total of $10^{12}$ wires, there is over a 99.995% chance that all 10 wires are unique. Therefore, coded wires can be randomly selected to obtain the desired independent nanoscale addressability, thus overcoming the need for deterministic selection of the nanoscale wires to include in a particular array.

The left ohmic contact 30 allows a conduction path to be established along the nanoscale wires 11 from a source voltage. During operation, only the second address decoder 20 is used. However, the first address decoder 10 allows the second address decoder 20 to be programmed, as later explained. The right ohmic contact 12 of FIG. 1 provides a nominal voltage, while the microscale wire 13 and the separation layer 16, which form a FET arrangement 19, provide an electrical field that allows such nominal voltage to be disconnected.

The arrangement formed by the ohmic contact 30 and the first and second address decoders 10, 20 allows a voltage to be put on a single nanoscale wire of the set of nanoscale wires 11. In order to make the selected nanoscale wire distinguishable from the rest of the nanoscale wires, it is preferable to drive the non-selected nanoscale wires to a different voltage, for example pulling the selected nanoscale wire close to Vhigh and pulling the non-selected nanoscale wires close to ground. This can be performed in two different ways.

According to a first way, the ohmic contact 12 can be driven to a voltage which is the opposite of the voltage on the ohmic contact 30, and the microscale wire 13 and second decoder 20 used to control the resistance of the nanoscale wires in the region between elements 19 and 20 in a way that such resistance is high but not as high as a disconnect resistance of the non-selected nanoscale wires determined by the first decoder 10 and the microscale wires 17. In this manner, each nanoscale wire acts as a voltage divider between ohmic contact 30 and ohmic contact 12. Assuming the voltage at ohmic contact 30 is Vhigh and the voltage at ohmic contact 12 is Vlow, the following relationship will be established:

$$Vout=(Vhigh-Vlow)*R19/(R19+Rdecode),$$

where R19 is the resistance induced by the FET 19 on the nanoscale wire and Rdecode is the resistance induced by the addressing microscale wires 17 and 18. For the selected nanoscale wire Rdecode is small (Rdecode<<R19), whereas for the non-selected nanoscale wires Rdecode is larger (Rdecode>>R19). As a consequence, the selected nanoscale wire will be pulled close to Vhigh, while all the other nanoscale wires will be pulled close to ground. Of course, if the voltage at 30 is Vlow and the voltage at 12 is Vhigh, the opposite will happen.

According to a second way, ohmic contact 12 can be driven to the opposite voltage of ohmic contact 30 and the microwire 13 and the decoder 20 be used to charge all the nanoscale wires 11 to the opposite voltage of the ohmic contact 30. In particular, the voltage on the microscale wire 13 is driven to the enable voltage (for example a low voltage for a depletion, mode, P-type nanoscale wire). As a result, the outputs of the nanoscale wires are coupled to Vhigh at ohmic contact 12 and charged accordingly. After this, the voltage on microscale wire 13 is driven to the disable voltage (for example a high voltage for a depletion mode, P-type nanoscale wire), thus isolating the outputs of the nanoscale wires from the supply at ohmic contact 12. After this, the addresses and a voltage at ohmic contact 30 are applied to select the single nanoscale wire, resulting in charging the selected nanoscale wire to the voltage on the ohmic contact 30 and keeping the remaining nanoscale wires at the precharge voltage.

As already noted above, the regions 14, 15, and 16 represent oxide layers which separate nanoscale wires from microscale wires, and allow a Field-Effect Transistor (FET) behavior to be obtained. See, for example, Yu Huang, Xiangfeng Duan, Yi Cui, Lincoln Lauhon, Kevin Kim and Charles M. Lieber, "Logic Gates and Computation from Assembled Nanoscale wire Building Blocks," Science, 2001, v294, p 1313–1317, V. Derycke, R. Martel, J. Appenzeller and Ph. Avouris, "Carbon Nanotube Inter- and Intramolecular Logic Gates," Nano Letters, 2001,v1n9, p 435–456, and Sander J. Trans, Alwin R. M. Verschueren and Cees Dekker, "Room-temperature Transistor Based on a Single Carbon Nanotube," Nature, 1998, v393, p 49–51, May 7.

According to a preferred embodiment of the present disclosure, the decoder 20 will be used to build a deterministically addressed decoder which can, in turn, be used to build a deterministically addressable memory.

Figure 2:
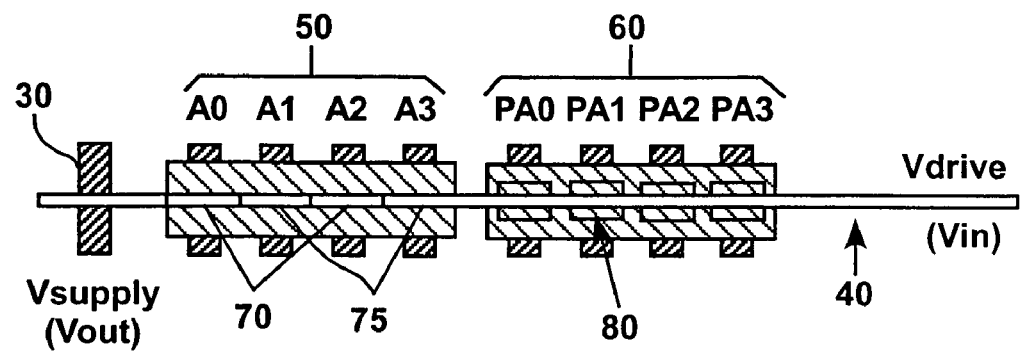
FIG. 2 shows an expanded detail of the structure of FIG. 1.

FIG. 2 shows an expanded detail of the structure of FIG. 1, wherein reference is made to a single nanoscale wire address line 40 of the nanoscale wires 11 of FIG. 1. The nanoscale wire line 40 is modulation-doped (axially distributed controllable regions 70, 75) in the way explained above and in U.S. patent application Ser. No. 10/627,405. Modulation doping allows an address to be built into a nanoscale wire. Assuming that the nanoscale wires are depletion mode P-doped silicon nanoscale wires, current flows with no or low voltage applied, and the current flow can be stopped by applying a voltage which is higher than a threshold for a given doping. In case of N-doped silicon nanoscale wires, current flows when voltage higher than a certain threshold is applied, and the current flow can be stopped by applying a voltage which is lower than that threshold. See, for example, Mark S. Gudiksen, Lincoln J. Lauhon, Jianfang Wang, David C. Smith, and Charles M. Lieber, "Growth of nanoscale wire superlattice structures for nanoscale photonics and electronics," Nature, v415 p 617–620, February 2002, Yiying Wu, Rong Fan, and Peidong Yang, "Block-by-block growth of single-crystalline Si/SiGe superlattice nanoscale wires," Nano Letters, v2 n2, p 83–86, February 2002, and M. T. Bjork, B. J. Ohlsson, T. Sass, A. I. Persson, C. Thelander, M. H. Magnusson, K. Depper, L. R. Wallenberg, and L. Samuelson, "One-dimensional steeplechase for electrons realized," Nano Letters, v2 n2, p 87–89, February 2002.

Selection of the single nanoscale wire 40 is obtained by means of lightly doped, pre-fabrication regions 70. The regions 70 are controllable by means of the ohmic contacts A0–A3. In particular, with N-type nanoscale wires, a high voltage (or a low voltage for P-type nanoscale wires) on microscale wires A0 and A2 will allow conduction along the nanoscale wire 40, thus allowing the nanoscale wire 40 to be selected. In view of the fact that the lightly doped regions 70 of the nanoscale wire 40 are present in correspondence of the A0, A2 microscale wire lines, the nanoscale wire 40 will be selected by means of the digital voltage (0101) on the lines A0–A3. This allows a voltage differential to be placed across each of the subsequent PA0/40, PA1/40, PA2/40, and PA3/40 junctions.

The conduction path through the nanoscale wire 40 passes from a source voltage Vsupply on the ohmic contact 30 through the nanoscale wire 40.

The programmable region 60 comprises nanoscale wire/microscale wire junction squares 80. The junction squares 80 can be programmed to be controlling or non-controlling. A junction is controlling if it conducts across the nanoscale wire length only when the crossing microscale wire (PA0, PA1, PA2, PA3) has the appropriate voltage (high or low depending on the kind of logic used). A nanoscale wire/microscale wire junction is not controlling if it conducts across the nanoscale wire length independently of the voltage on the crossing microscale wire.

According to the present disclosure, it is always possible to drive all microscale address inputs to one of the decoders to a pass through voltage, as later explained, so that the decoder does not gate conduction. For example, a first phase of the selection method can comprise address discovery, i.e. discovery of which nanoscale wire addresses are present and functional. During such phase, only the pre-fabrication addresses A0–A3 are used, and the programmable lines PA0–PA3 act as pass through. The address discovery phase allows to determine which address lines are functional.

A further phase is a programming phase, which takes place once a set of usable nanoscale wires has been identified. During the programming phase, the pre-fabrication addresses A0–A3 are used to select a single nanoscale wire and the programming addresses PA0–PA3 are used to place a programming voltage differential across only the microscale wire and nanoscale wire which make up the junction, for example the nanoscale wire 40 and the microscale wire PA1 of FIG. 2.

Finally, during operation, all of the pre-fabrication addresses A0–A3 are driven to an appropriate voltage allowing all of the nanoscale wires to conduct (i.e. a low voltage in case of P-type nanoscale wires), and the programming addresses PA0–PA3 are used to actually address the array during reading/writing operations from/to the memory.

It should be noted that there is no directionality to the conduction through the set of controllable junctions. As a consequence, the structure of FIG. 2 can also be used as a multiplexer, thus allowing conduction between a single one of the nanoscale wires 11 of FIG. 1, for example the nanoscale wire 40 of FIG. 2, on the right and the common microscale wire line 30 on the left of FIGS. 1 and 2. In particular, if Vsupply is driven to an appropriate voltage, then that voltage will conduct through the nanoscale wire 40 to the output Vdrive only when the PA addresses allow conduction across the programmable region 60. Therefore, a single, unique nanoscale wire can be selected for conduction. On the other side, if Vin is driven on each nanoscale wire, then one can listen on Vout. The PA addresses will allow conduction from Vin to Vout only for the nanoscale wire whose programmed address matched the current PA addresses, i.e. allowing the arrangement to function as a multiplexer.

Figure 3:
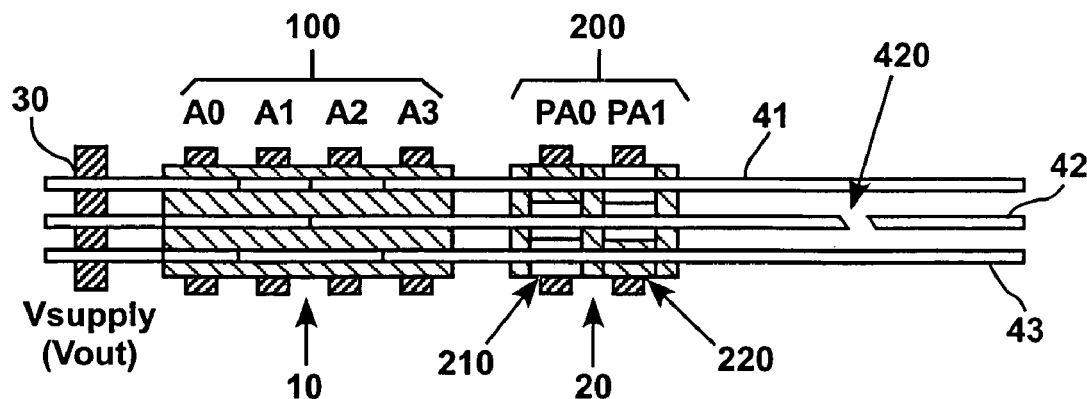
FIG. 3 shows a particular example of the structures shown in FIGS. 1 and 2.

FIG. 3 shows a particular embodiment of the structure shown in FIGS. 1 and 2, where number 100 indicates the microscale wires A0–A3 input to the addressing decoder 10 and 200 indicates the microscale wires PA0–PA1 input to the programmable decoder 20. A 4-bit (A0, A1, A2, A3) 2-hot code is used for the addressing decoder 10. A 2-hot code means that the nanoscale wires have two controllable regions. This gives a number of $$\binom{4}{2} = 6$$

possible hot codes. In the array of FIG. 3, only three of those codes are present. In particular, code (0101) is associated with nanoscale wire 41, code (1100) is associated with nanoscale wire 42, and code (1001) is associated with nanoscale wire 43. In other words, nanoscale wire 41 is selected by the values A0=0, A1=1, A2=0, and A3=1 on the address lines, nanoscale wire 42 is selected by the values A0=1, A1=1, A2=0, A3=0, and nanoscale wire 43 is selected by the values A0=1, A1=0, A2=0, and A3=1. It should be noted that nanoscale wire 42 is broken at 420. Therefore, code (1100) is associated with a defective or broken nanoscale wire. In other words, the steps of selecting a nanoscale wire and associating a code to the selected nanoscale wire also apply to defective nanoscale wires. Unusable codes can be associated to defective nanoscale wires to prevent those defective nanoscale wires from being addressed.

As already explained before with reference to the description of FIG. 2, the programmable decoder 20 can be programmed to have two types of junctions: junctions 210 which control conduction, and junctions 220 which do not control conduction.

In the embodiment of FIG. 3, the first good nanoscale wire 41 (A0:A3=0101) is programmed to be controlled only by the second programmable address line PA1. This allows the nanoscale wire 41 to conduct when the address 01 or 11 is presented on the inputs PA0, PA1. Further, the second good nanoscale wire 43 (A0:A3=1001) is programmed to be controlled only by the first programmable address PA0. This allows the nanoscale wire 43 to conduct when the address 10 or 11 is presented on the inputs PA0, PA1.

However, it is desired to avoid that defective or broken nanoscale wires, such as nanoscale wire 42, are selected. Generally, all non-present or broken addresses will be programmed so they are controlled by all lines. In the case of FIG. 3, that means that the broken wire (1100) 43 is programmed to be controlled by both programmable address lines PA0 and PA1. Therefore, the code (PA0:PA=01) will be used to address nanoscale wire 41, and the code (PA0:PA1=10) will be used to address nanoscale wire 43. As a result, the broken wire is not selected when either non-broken wire is addressed. In general, the broken wires will be assigned codes outside of the codespace used for functional wires.

The person skilled in the art will appreciate that each nanoscale wire is actually treating each address bit at the non-controlled junctions as a don't care bit rather than a bit that must have a particular value to allow conduction. Consequently, coding schemes which are different from a normal binary encoding will be adopted. For example, a dual-rail code can be used, i.e. where both polarities of all address signals are brought in. In the embodiment of FIG. 3, one could think about PA0:PA1 as a single address line with PA1=$\overline{PA0}$, so that the 01 encoding corresponds to address 0 and the 10 encoding corresponds to address 1. In this way, in order to assign an address bit to a code, the controllable region is placed under exactly one of the inverted or non-inverted inputs.

Figure 4:
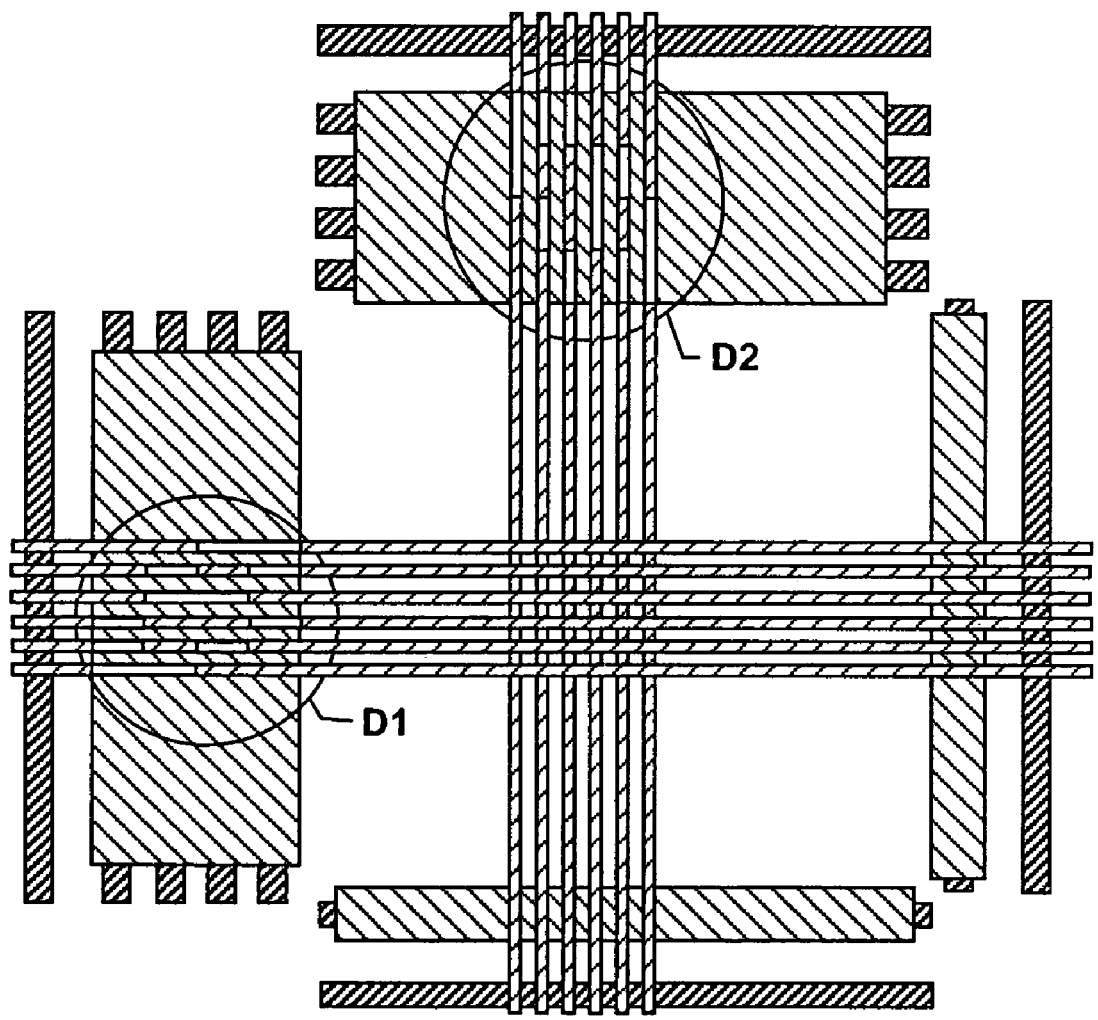
FIG. 4 shows a nanoscale memory array using modulation-doped address decoders.

FIG. 4 shows a nanoscale memory array using modulation-doped address decoders as shown in U.S. patent application Ser. No. 10/627,405 or U.S. patent application Ser. No. 10/627,406, which are incorporated herein by reference in their entirety. According to the present disclosure, each of the stochastic decoders D1, D2 of FIG. 4 is replaced by a combination of the stochastic and deterministic decoders 10, 20 shown in the previous figures.

Figure 5:
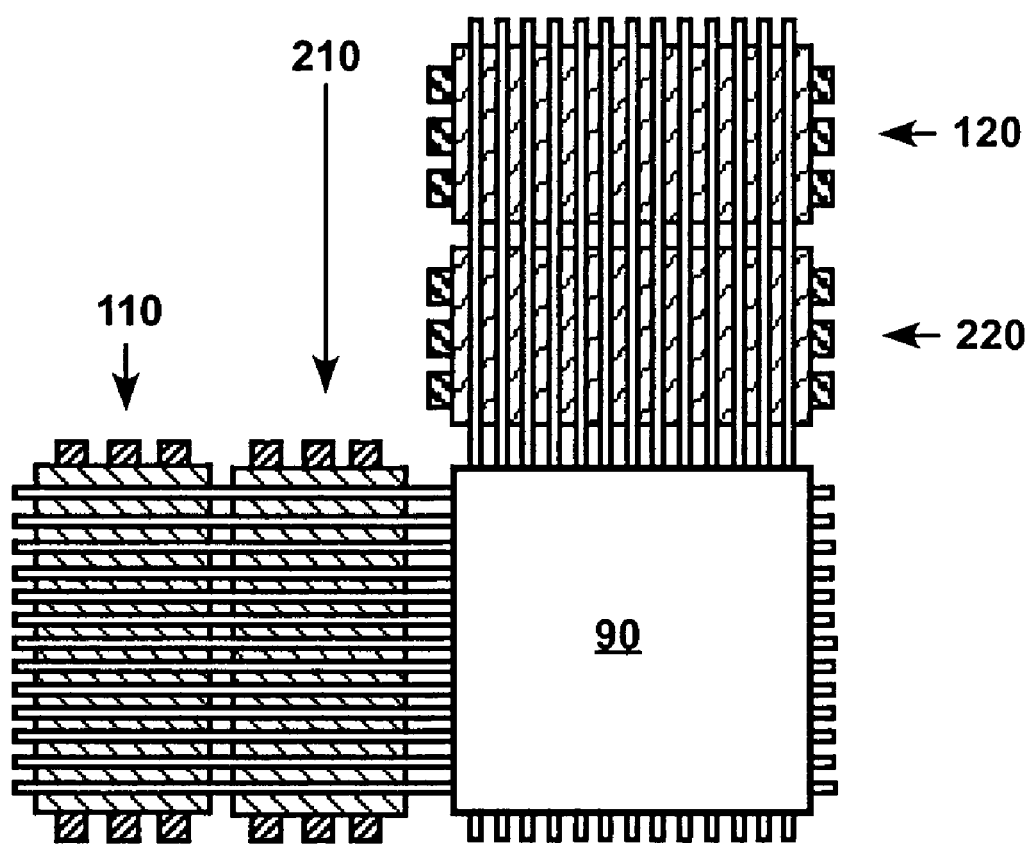
FIG. 5 shows a schematic representation of the topology for a memory core with address correction.

For example, FIG. 5 shows the basic topology for a non-volatile RAM memory core 90, where stochastic and deterministic row decoders 110, 210 and stochastic and deterministic column decoders 120, 220 are present.

As explained before, during testing and discovery, the stochastic control microscale lines are used. During operation, the stochastic control microscale lines are all driven to suitable voltages to control conduction. Electrically, this makes the stochastic control microscale lines behave simply as pass through wire segments. The deterministic, programmable addresses are then used during operation.

According to a first embodiment, the programmable deterministic decoder can be built using one-time-programmable field-effect junctions, where the address programming is permanent. According to a second embodiment, the programmable deterministic decoder can be built using re-programmable field-effect junctions. In this embodiment, spares could be reserved in the array and the device lifetime extended by programming around new defects that may arise during operation. According to a third embodiment, the programmable decoder can be built from programmable diode crosspoints, as shown in FIG. 6.

Figure 6:
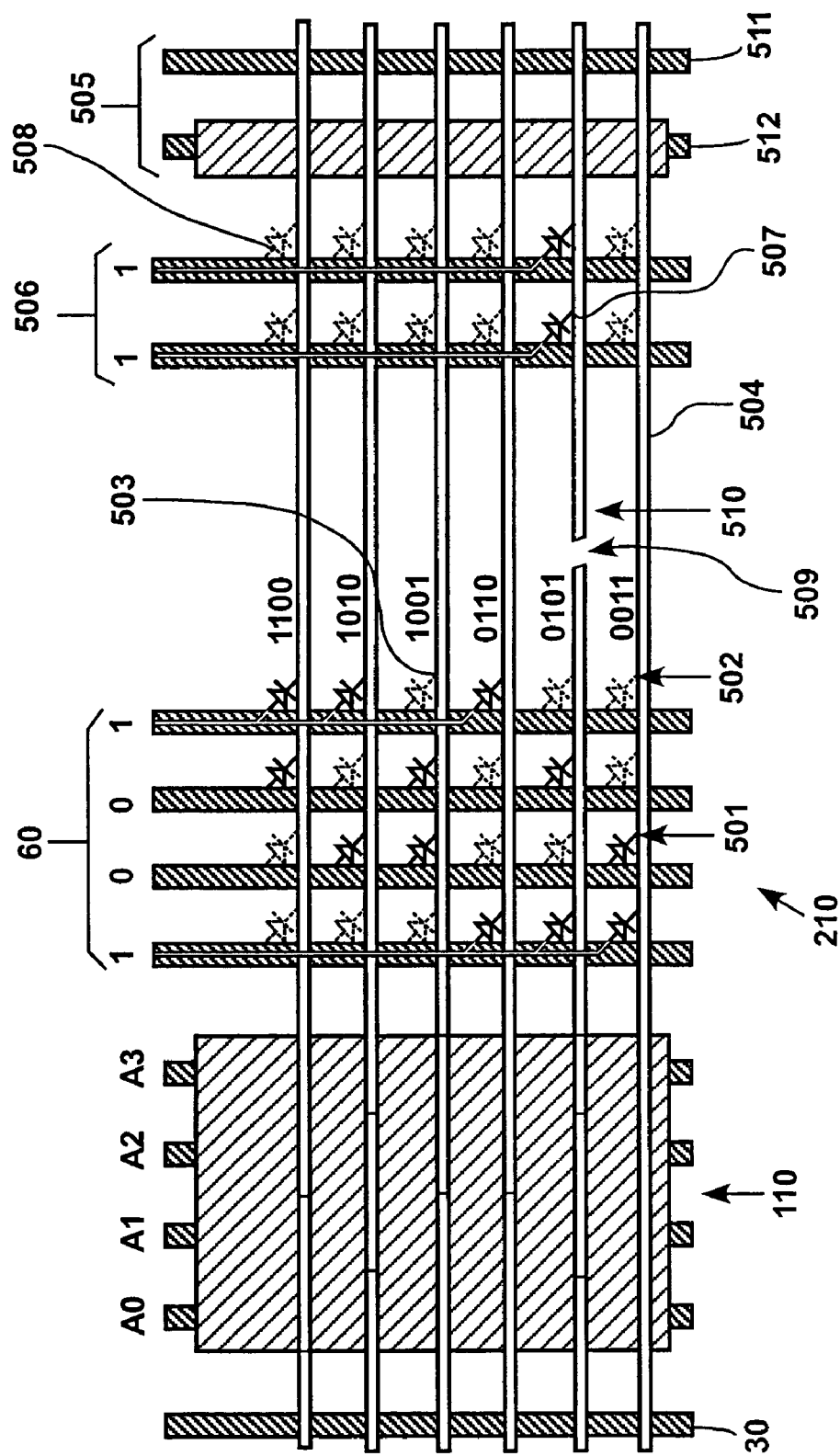
FIG. 6 shows an embodiment of the present disclosure where the programmable decoder is built from programmable diode crosspoints.

In FIG. 6, a first set of diodes 501 of the programmable decoder 210 is shown in solid lines, and a second set of diodes 502 of the programmable decoder 210 is shown in broken lines. The diodes 501 are programmed ON, while the diodes 502 are programmed OFF.

According to the embodiment of FIG. 6, a low nanoscale wire output can be selected through the microscale wires 60. In order to do so, the diodes 501, 502 connecting the microscale wires 60 with the nanoscale wires are so programmed that the diodes are OFF when a '1' is sent on the addresses PA0 . . . PA3 60 to select a particular nanoscale wire and the diodes are ON where a '0' is sent on such addresses to select that nanoscale wire. For example, it can be arranged that the nanoscale wire 503 is the only nanoscale wire among the nanoscale wires which does not have a conduction path to the high inputs. As already explained before, the programming phase (i.e. deciding which diodes must be ON and which diodes must be OFF) occurs by selecting each of the nanoscale wires by means of the A0–A3 control lines of the stochastic decoder 110.

After the programming phase, during operation, the microscale addresses 60 will allow selection of the reading/writing addresses. For example, the voltages 1001 on the addresses 60 will select the nanoscale wire 503. Similarly, the voltages 0011 will select the nanoscale wire 504. In other words, if an address line 60 holds a '1' and the nanoscale wire expects a '0' (has its diode programmed ON), then the line will be pulled high by the input so that it is not selected as the designated output. As a consequence, when an address input 60 is applied, only the desired input will have OFF diodes exactly where the input 1's are and will remain low. All other lines will be pulled high through programmed ON diodes. All lines are precharged low. The desired output is either left low by precharge or held low by a weak static load 505. The load 505 comprises ohmic contacts 511, 512 to respectively provide or disconnect a nominal voltage.

In particular, the ohmic contact 511 can always hold the nominal voltage and the microscale control voltage on the ohmic contact 512 will control whether or not the nominal voltage on 511 is exposed to the nanoscale wires. As already explained with reference to FIG. 1, this is done by application of a field to the nanoscale wires in the region where the microscale wire 512 crosses the nanoscale wires. If the voltage is high (depletion mode, P-type case), the nanoscale wires do not conduct across that region (i.e. they have a very high resistance). If the voltage is low, the nanoscale wires conduct across that region (i.e. they have a low resistance). Selection of a nanoscale wire among the nanoscale wires will allow that nanoscale wire to exhibit a weak resistance, thus conducting, as already explained with reference to FIG. 1.

Similarly to what explained in FIG. 1, all nanoscale lines are precharged to a nominal level. This is done by driving microscale wire 512 to the enable voltage (low for a depletion mode, P-type). Once the nanoscale wires are at a low voltage, the nominal voltage is disconnected from the nanoscale wires by switching ohmic contact 512 to the opposite polarity (high for a depletion mode, P-type). After that, when the inputs on the microscale wires 60 are applied, the inputs will conduct through all but one of the nanoscale wires. The one nanoscale wire which does not get current from the inputs at 60 will remain at this nominal voltage.

Advantageously, the embodiment of FIG. 6 also comprises an additional set 506 of inputs near the precharge/static load device 505 to disable broken nanoscale wire segments. Programmable diodes 507, 508 are provided with the additional inputs 506. In particular, the diodes are all programmed ON for unused wires such as the nanoscale wire 509 broken at 510 and the inputs are all driven high. In this way, any break in the nanoscale wires between the load and the address region will not look like selected lines.

Therefore, FIG. 6 shows an arrangement which allows a single voltage to be placed on a selected line. The selected line can be driven high or low, according to the type of nanoscale wires used.

According to a further embodiment of the present disclosure, the decoded line can be used to select a single word in a diode crosspoint memory array, such as the memory array shown in the central portion of FIG. 4.

Figure 7:
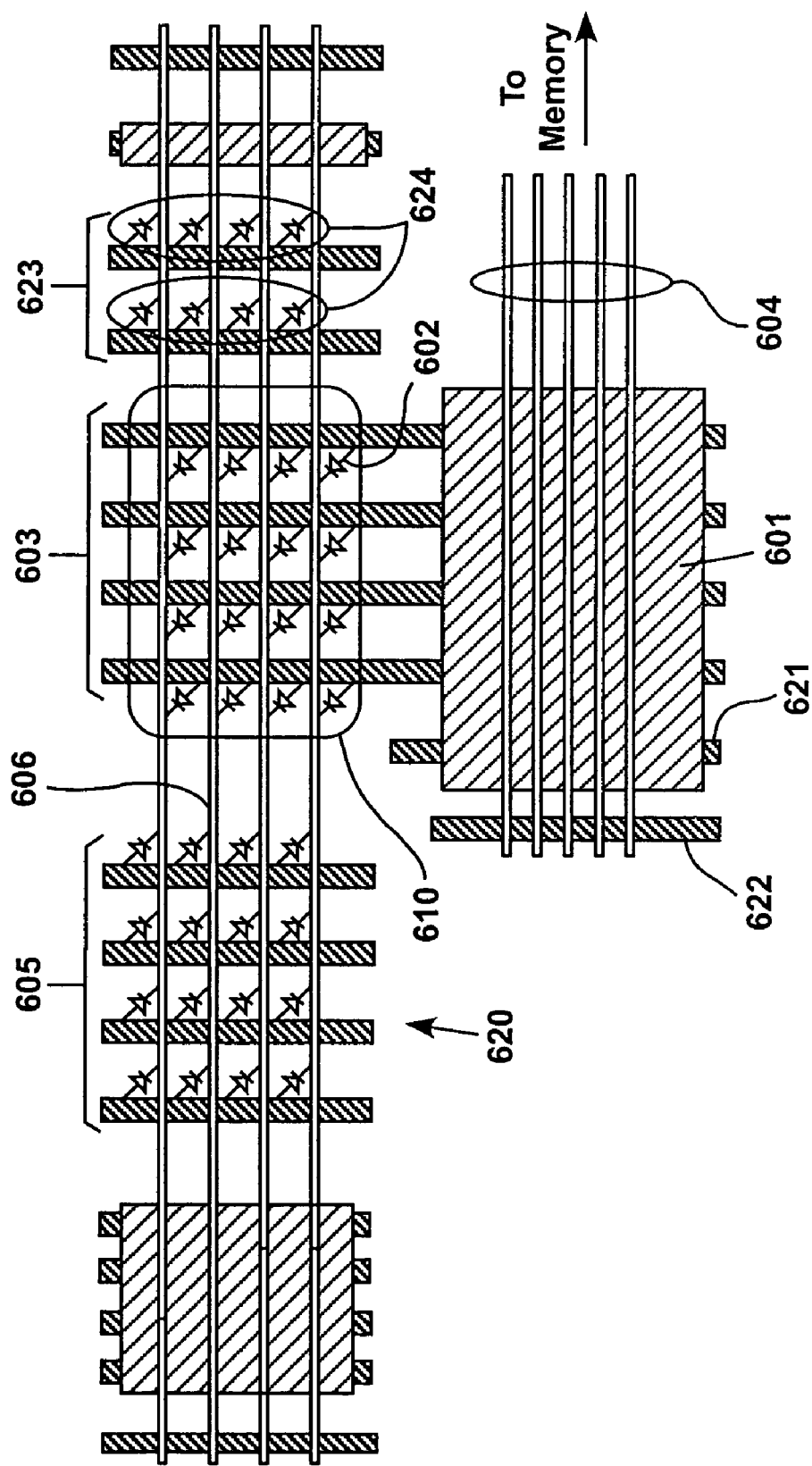
FIGS. 7 and 8 show a schematic representation of a diode-programmable multiplexer in accordance with the present disclosure.

FIG. 7 shows the basic arrangement for an output multiplexer. A further stochastic address decoder 601 is provided. The stochastic decoder 601 receives inputs along microscale wire lines 603 and outputs signals to a memory core (see, for example, the memory core 90 of FIG. 5) along nanoscale wire lines 604. The addresses for the stochastic decoder 601 are stored by means of a translation memory 610 formed by a combination of programmable diodes 602 and microscale wire address lines 603. The person skilled in the art will note that all the diodes of FIG. 7 are shown ON for clarity reasons only, being it understood that those diodes will be programmed according to the circumstances, already explained with reference to FIG. 6.

During operation, the addresses are applied to the deterministic microscale wire inputs 605 of the decoder 620 as described above. This results in a single horizontal nanoscale wire line 606 between the decoder 620 and the address translation unit 610 being pulled low. The undriven, vertical address translation lines 603 are arranged to be precharged or driven high. Only the selected line 606 provides a low voltage coupling through its programmed ON junctions in the address translation memory. Where there is a programmed ON junction in this selected word, the vertical address translation line corresponding to that ON junction can be pulled low, the remaining vertical address translation lines will remain high. In this manner, a programmed address is placed onto the address translation lines 603 for the final stochastic decoder 601.

Figure 8:
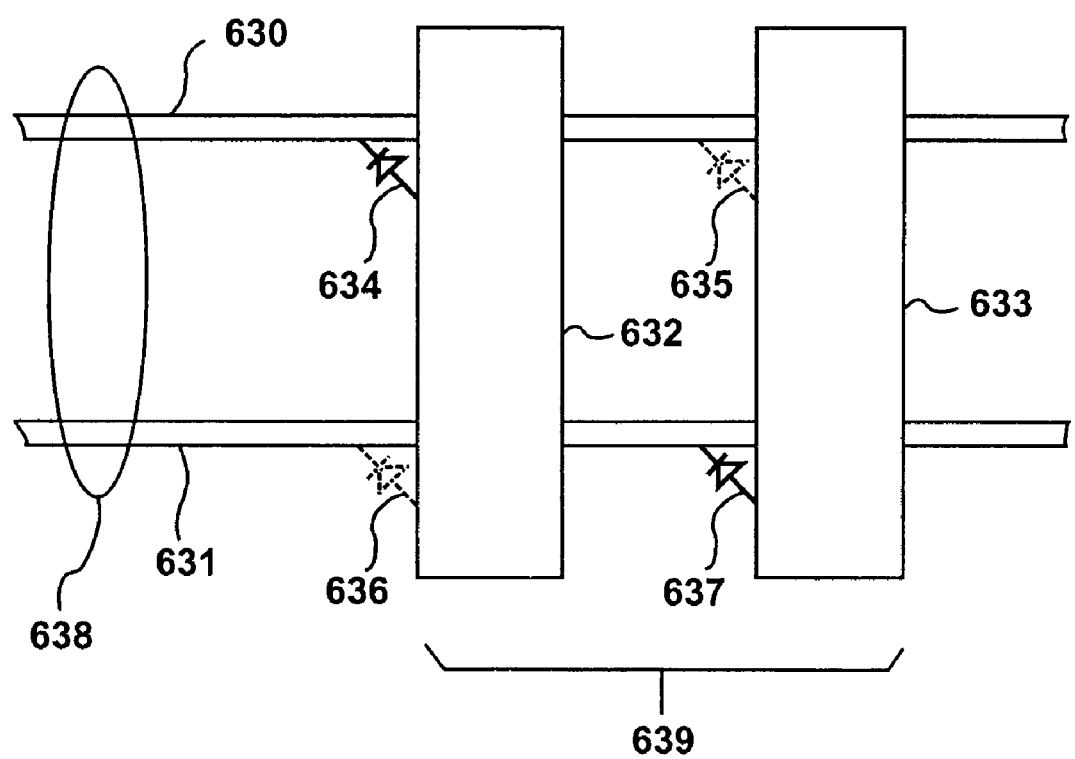

The above concept can be better understood with reference to the simple arrangement of FIG. 8 which shows nanoscale wires 630, 631, microscale wires 632, 633, and diodes 634, 635, 636, and 637. Diodes 634 and 637 are programmed ON, while diodes 635, 636 are programmed OFF. The input is formed by the voltage status of the nanoscale wires 630, 631 at 638, while the output is formed by the voltage status of the microscale wires 632, 633 at 639. If the nanoscale wire 630 is low and the nanoscale wire 631 is high, the microscale wire 632 will be pulled low and the microscale 633 will remain high. On the other hand, if the nanoscale wire 630 is high and the nanoscale wire 631 is low, the microscale wire 632 will remain high and the microscale wire 633 will be pulled low.

Turning to FIG. 7, it should be noted that the address translation output lines 603 are only loaded capacitively by their output to the final stochastic decoder 601. No current is drawn from the lines 603 to enable the output. It is also worthwhile to note that there is at most a single diode in all paths from a microscale source voltage to the output. A pair of diode arrays is used, but current does not flow through the diodes in series.

In particular, current flows from the microscale wires 605 through the diodes of the decoder 620 and onto the nanoscale wires. Current also flows from the microscale wires 603 through the diodes 610 to the nanoscale wires. However, in view of the fact that the diodes in 620 and 610 both point into the nanoscale wires, there will be no current flow that goes through both the 620 and 610 diodes. This is significant because (a) there is only one, not two diode drops in the signal path and (b) the resistance on only one diode must be accounted for in each current path. A pair of diode drops would make the voltage seen at 601 lower and would make the time to charge the 610 lines to drive the final stochastic decoder 601 slower.

It should be noted that the embodiment of FIG. 7 allows either a high or a low voltage to be transmitted from the ohmic contact 622 to one of the nanoscale wires 604.

Similarly to the embodiments of FIG. 3 and FIG. 6, also in the embodiment of FIG. 7 unusable codes can be associated with defective nanoscale wires to prevent those defective nanoscale wires from being addressed. Therefore, the embodiment of FIG. 7 can also comprise an additional set 623 of inputs to disable broken nanoscale wire segments. Programmable diodes 624 are provided with the additional inputs 623.

According to the present disclosure, multiple wires (see, for example, microscale wires 506 in FIG. 6 and microscale wires 623 in FIG. 7) can be used to guarantee that the nanoscale wires can be controlled even in the presence of programmable crosspoint faults which make some of the individual crosspoints not programmable.

In particular, if too few molecules, or no molecules, are present at the junction, that junction cannot be programmed ON. These programmable junction faults should preferably be tolerated when programming the deterministic addresses.

A wire that cannot hold one address may, however, be able to hold another address. Therefore, translation addresses can be assigned to wires such that the non-programmable bits in the address lines correspond to OFF diodes in the programmed translation addresses.

A possible greedy translation assignment scheme is as follows:

1. Choose an unassigned address;

2. Try programming the address into unused address translation wires until a wire is found that is compatible with the address;

3. Greedily allocate that wire to the current address; and

4. Repeat until all translation addresses have been placed

Address discovery of the stochastic decoder 601 of FIG. 7 occurs by directly driving the microscale lines 603. The microscale lines 603 are also used when programming the memory bits into the address translation memory 610.

In accordance with the present disclosure, a memory can be built by assembling one of the address translation arrays 610 as the row address decoder and a second address translation array as the column address decoder along with an address core.

The decoder 601 of FIG. 7 also comprises a Program/Read Enable input 621, which performs a field-effect gating function on the nanoscale wires 604. This allows the supply 622 to be isolated from the nanoscale wires 604. Isolation is useful while switching the address translation wires 603. Once the microscale wires 603 have settled and the supply/output contact 622 has been set at the appropriate voltage level for a write operation, or has not been driven for a read operation, the input 621 can be used to re-enable conduction between the nanoscale wires 604 and the supply/output 622. Therefore, the presence of the input 621 advantageously prevents from prematurely discharging something that may be read from the array, and prevents against programming the wrong row or column line in the array.

Figure 9:
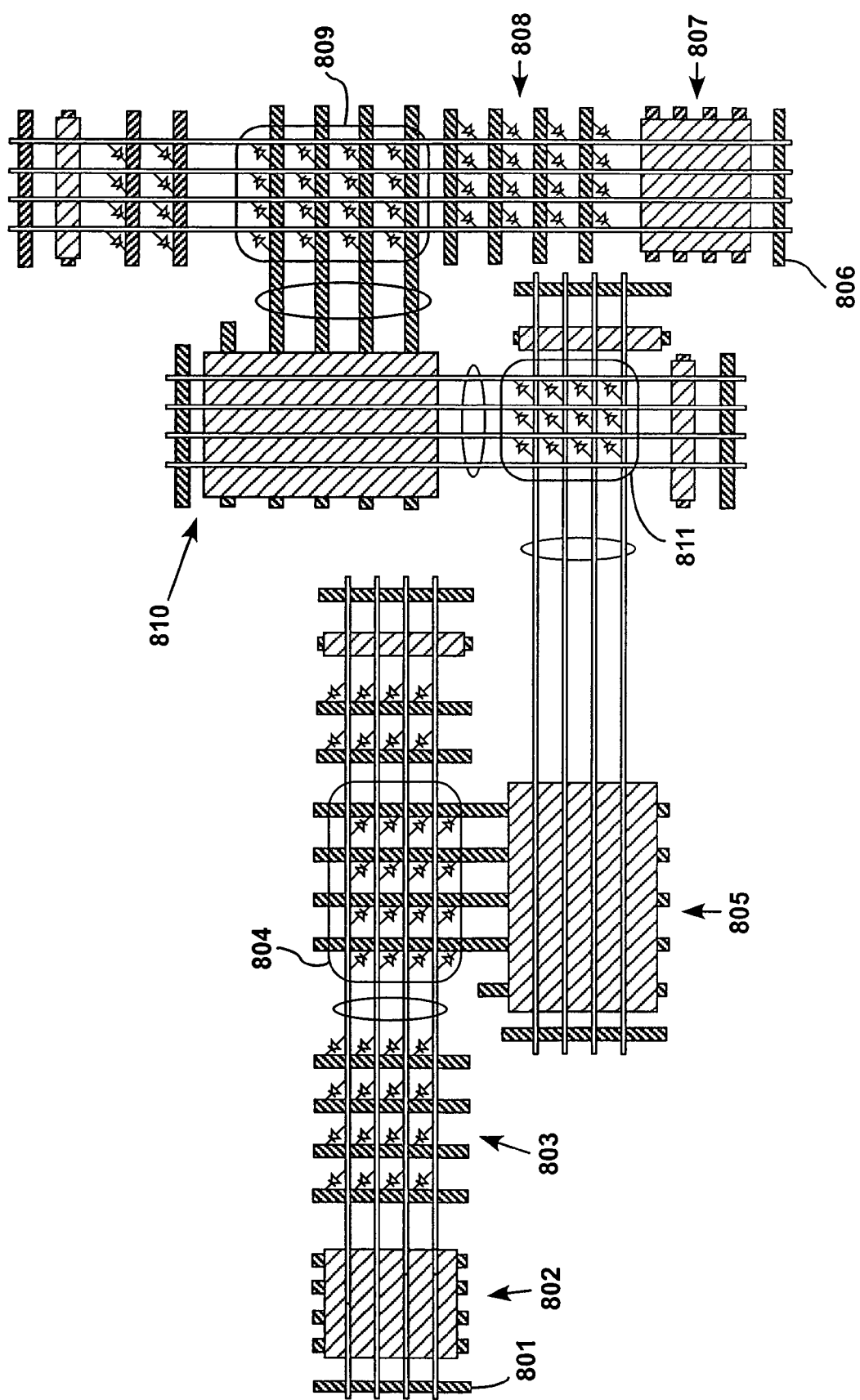
FIG. 9 shows a schematic structure of a diode-corrected memory array.

FIG. 9 shows a schematic structure of an arrangement for addressing a memory core or array. The 'row' section of FIG. 9 shows a microscale wire ohmic contact 801 to the supply line, a stochastic row decoder 802, a deterministic row decoder 803, a row address translation section 804, and a row final stochastic decoder 805. Similarly, the 'column' section of FIG. 9 shows a microscale wire ohmic contact 806 to the supply line, a stochastic column decoder 807, a deterministic column decoder 808, an address translation section 809, and a final stochastic decoder 810.

The row and column wires in the memory array 811 will preferably use different nanoscale wire types (P-type and N-type) in order to achieve the diode directionality in the memory core needed for point addressability. In other words, if the crosspoints in the memory array 811 only acted as resistors, coupling could be inadvertently obtained from a selected column line to other column lines through programmed junctions on the row. To avoid this, the diode can be advantageously made directional by using P-type nanoscale wires for one direction (e.g. columns) and N-type nanoscale wires for another direction (e.g. rows). This means that the final row and column stochastic decoders 805 and 810 are of different nanoscale wire types. Consequently, each final decoder will be driven with different select polarities. Additionally, the row and column diode translation units 804 and 809 will be of opposite polarities as well. This is because enable voltages for P-type and N-type nanoscale wires are opposite. P-type nanoscale wires need a low voltage to enable conduction, while N-type nanoscale wires need a high voltage to enable conduction. Therefore, if P-type nanoscale wires are used for the columns and N-type nanoscale wires are used for the rows, the enable voltages will have opposite polarities.

With reference to the embodiments of FIGS. 6, 7, 8, and 9, the person skilled in the art will understand that ON-OFF devices that are different from diodes and/or exhibit a diode-like behavior can be used, such as transistors working as diodes.

Figure 10:
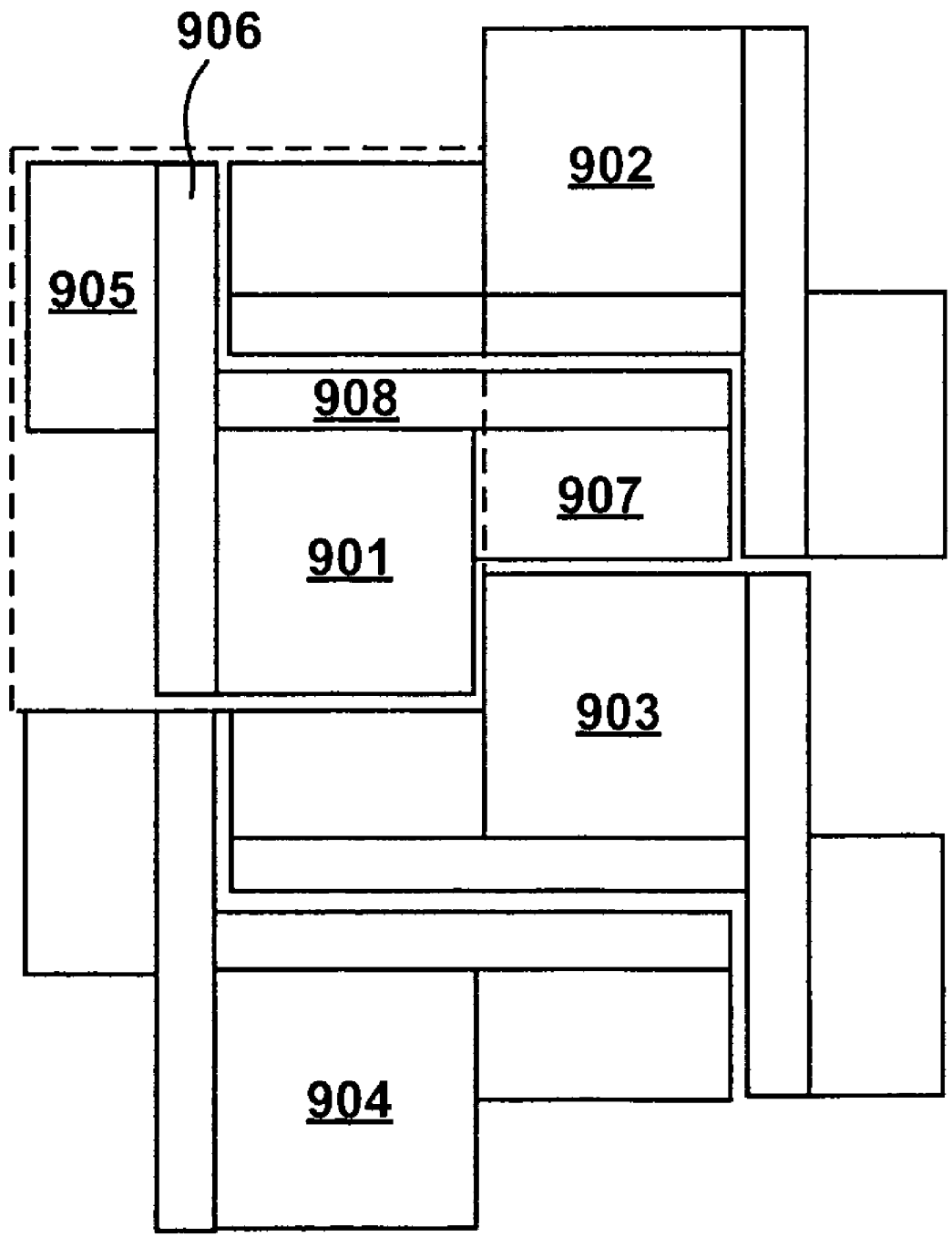
FIG. 10 shows a possible tiling on chip of the structure shown in FIG. 9.

FIG. 10 shows a possible tiling on a chip of the structure shown in FIG. 9. In particular, the structure of FIG. 10 shows four memory cores 901, 902, 903, and 904. Associated with the memory core 901 are a row stochastic/deterministic decoder unit 905, a row address translation section 906, a column stochastic/deterministic decoder unit 907, and a column address translation section 908. Similar considerations apply to the structure surrounding the remaining memory cores 902, 903, and 904. The overall structure of FIG. 10 shows how the four units are tiled together in pairs of opposite orientation, to minimize space occupation.

A more modest number of microscale address bits can be used by means of a hybrid control scheme, where a set of nanoscale wires is first selected by a microscale wire ohmic contact and then the selected set of nanoscale wires is addressed by microscale wires.

Figure 11:
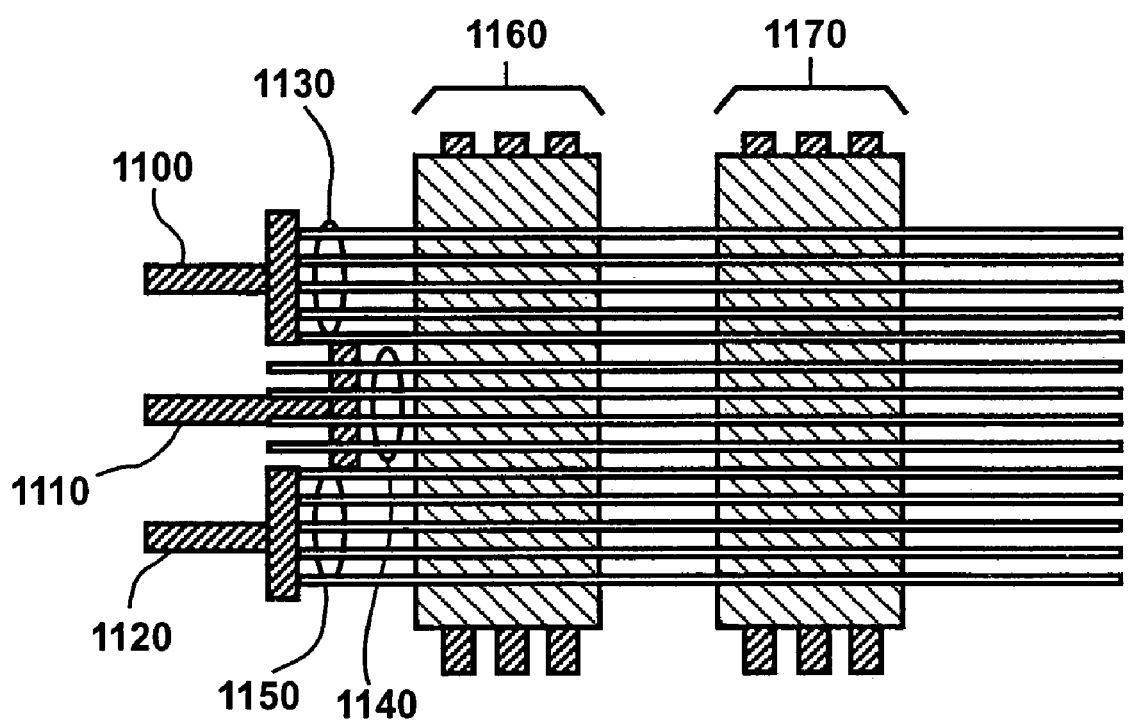
FIG. 11 shows an embodiment of a programmable deterministic decoder using hybrid micro-nanoscale stochastic addressing.

For example, FIG. 11 shows an embodiment of a programmable deterministic decoder using hybrid micro-nanoscale stochastic addressing. In particular, staggered adjacent microscale wire contacts 1100, 1110, and 1120 are provided. The microscale contact 1100 will allow the set of nanoscale wires 1130 to be selected, the microscale contact 1110 will allow the set of nanoscale wires 1140 to be selected, and the microscale contact 1120 will allow the set of nanoscale wires 1150 to be selected. The effect of this is that the number of microscale address bits 1160 needed to address nanoscale wires and the size of the nanoscale wire address code space will be reduced resulting in a need for fewer axially distributed controllable regions.

With respect to the deterministic inputs 1170, two alternatives are possible. According to a first alternative, the inputs 1170 are used as in the previous embodiment, i.e. a full k-hot addressing is performed. According to a second alternative, the separate group contacts 1100, 1110, and 1120 are exploited to reduce the deterministic address inputs so that the inputs 1170 only address within one of the wire groups 1130, 1140, 1150. Addressing of wire groups is handled externally in microscale logic.

The hybrid addressing scheme allows to reduce the number of microscale address lines and reduce the total number of unique nanoscale wire codes needed to achieve suitable uniqueness. The hybrid scheme provides separate contacts at the lithographic scale to groups of wires. According to the embodiment of FIG. 11, the single, common row and column lines at the end of the stochastic decoder array are replaced with a set of segregated, microscale connections. In this way, only the stochastic addressing can be used to select among sets of nanoscale wires which cannot be distinguished by the microscale contract group.

Figure 12:
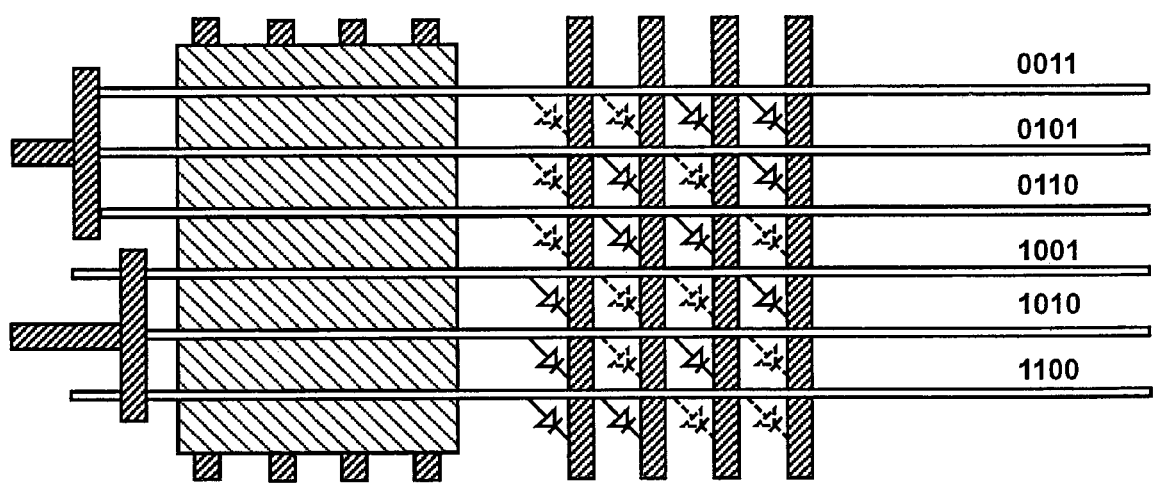
FIG. 12 shows an embodiment of the diode-based, programmable deterministic decoder using hybrid micro-nanoscale addressing.

FIG. 12 shows a hybrid embodiment similar to the one shown in FIG. 11, where a diode deterministic encoder is used.

The embodiment shown in FIGS. 11 and 12 allows hybrid stochastic addressing on diode-based address corrected memory. Here, the width of the output of the address translation memory need only be as wide as the group coding region on the final stochastic row decoder/multiplexer. In particular, the hybrid scheme only requires to distinguish among the nanoscale wires in a contact group. Consequently, a smaller address space is needed, because only the nanoscale within the contact group will need to be addressed. Assuming the microscale contacts are multiplexed/decoded, the address translation memory will only hold the group address for the associated nanoscale wire in the selected group. Since the group address space is smaller, fewer address bits are needed. Therefore, the width of the output of the address translation memory is smaller than in the non-hybrid case where all the nanoscale wires are collected into a single group.

Figure 13:
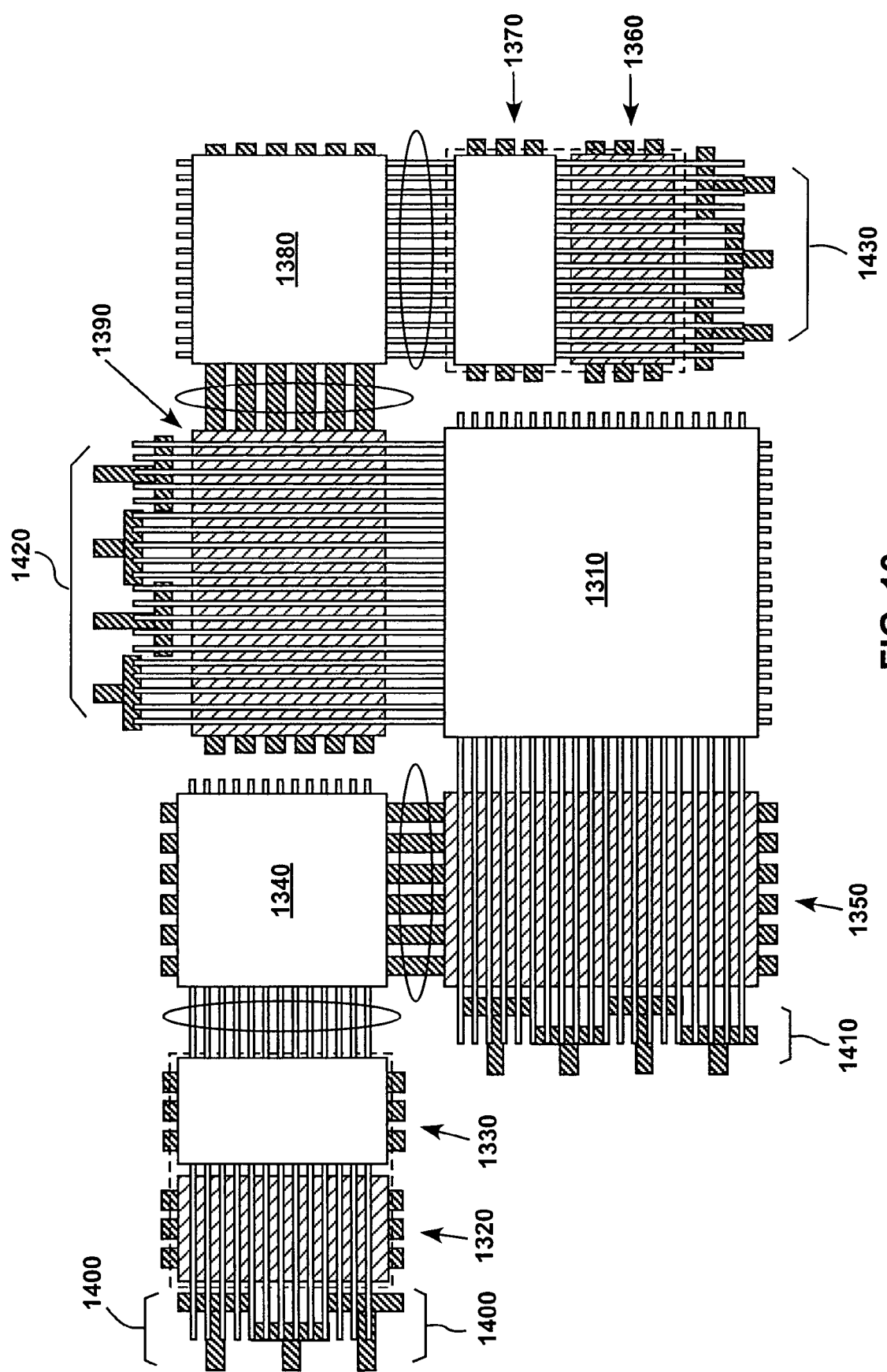
FIG. 13 shows a hybrid embodiment similar to the one shown in FIG. 9, where a diode deterministic encoder is used.

FIG. 13 shows a schematic view of a memory addressing arrangement making use of a hybrid scheme. A memory core 1310 (for example a non-volatile RAM) is connected to row addressing units and column addressing units. The row addressing units comprise a stochastic row decoder 1320, a programmable row decoder 1330, a row translation unit or memory 1340, and a final stochastic row decoder 1350. The column addressing units comprise a stochastic column decoder 1360, a programmable column decoder 1370, a column translation unit or memory 1380, and a final stochastic column decoder 1390. Also shown in FIG. 13 are ohmic contacts 1400, 1410, 1420, and 1430. Each ohmic contact is connected to a different subset of the plurality of nanoscale wires and allows a specific subset to be selected, as explained above.

Nanoscale Address Lines

Advantageously, the microscale wires 603 (see FIG. 7) which carry the output of the address translation memory can be replaced with nanoscale wires. This will reduce the size of the address translation unit and reduce the capacitance that must be driven on the translation unit's output wires.

When nanoscale wires are used for addressing, defects must be accommodated in the nanoscale wire address lines. The decoder nanoscale wire control regions should have the property that they can conduct with no applied field. In this way, a control region which is aligned with no address wire or a broken address wire will still allow conduction.

With this arrangement, one should make sure that the nanoscale wire control regions align with enough functional control regions to be uniquely addressable. In particular, if an even-weight code is used and some of the address lines are lost, the resulting code is a mix of codes with a different number of controllable regions. For example, consider starting with a 10-bit, 5-hot code. If two of the address lines are lost, then the resulting 8 addressable, coded regions could have 5, 4, or 3 hot codes. Since the number of coded bits is no longer the same, wires can be obtained that may have codes which are supersets of other codes. If the initial code space is chosen to be sparse enough, it will be possible to still have virtually unique codes.

In absence of faults, the above scheme requires over twice as many of the address translation output wires as compared with the use of reliable microscale wires. Further, due to faults, additional spares will need to be placed, for a total of about three to four times the microscale wires that could be used. However, this kind of embodiment is still advantageous, when compared to the use of microscale wires, if the nanoscale wire pitch is smaller than the microscale wire pitch by a sufficiently large factor. For example, the inventors have been using examples with 105 nm microscale pitch and 10 nm nanoscale wire pitch, so there is a net reduction in the width of the address translation unit around a factor of three.

Final Row Decoder Addressing and Discovery

Since the output wires of this embodiment are nanoscale, a further stochastic decoder is needed in order to address the nanoscale wires when programming to address the translation unit. The additional stochastic decoder will also allow to discover the addresses of the final stochastic decoder. If nanoscale wires are able to hold a charge for a reasonable length of time, an address can be built up on the address translation unit outputs serially by successively charging or discharging each of the lines. Otherwise, an address can be programmed into the address translation unit in order to test for address presence in the final stochastic decoders.

Multibit Words

In memory design, the bandwidth can be increased by reading multiple data bits in parallel. This is typically done either by:

1) Truncating the final multiplexer so that the row data read is taken and multiplexed down to the desired word width rather than multiplexed down to a single bit; or 2) Addressing multiple memory banks with the same address and concatenating the resulting bits or words.

With the deterministic address decoder according to the present disclosure, it is possible to address multiple memory banks with a single address and extract many bits in parallel. This works for all of the programmable address schemes introduced here.

The programmable field-effect decoder scheme can be adapted to provide multiple bits from a single memory bank. In particular, the common read line is split into separate microscale connections to the nanoscale wire array. Then, the nanoscale wire addresses are programmed up so that the same address is present in each of the nanoscale wire bundles associated with a distinct microscale output contact.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. A method for addressing a memory comprising:
   selecting a nanoscale wire from a plurality of nanoscale wires through a first set of microscale inputs;
   associating a code to the selected nanoscale wire through a second set of microscale inputs;
   repeating the selecting and associating steps in accordance with a number of nanoscale wires to be programmed;
   associating memory addresses of the memory to codes associated with the selected nanoscale wires; and
   selecting memory addresses of the memory by means of the second set of microscale inputs.

2. The method of claim 1, wherein the plurality of nanoscale wires are stochastically assembled.

3. The method of claim 2, wherein each nanoscale wire is provided with controllable regions axially distributed along the nanoscale wire.

4. The method of claim 3, wherein selecting the nanoscale wire occurs by either controlling or not controlling the controllable regions on nanoscale wires of the plurality of nanoscale wires.

5. The method of claim 1, wherein the steps of selecting a nanoscale wire and associating a code to the selected nanoscale wire also apply to defective nanoscale wires.

6. The method of claim 1, further comprising a step of testing whether a nanoscale wire is functional or defective.

7. The method of claim 1, wherein selecting a nanoscale wire from a plurality of nanoscale wires through a first set of microscale inputs comprises providing microscale ohmic contacts, each ohmic contact connected to a different subset of the plurality of nanoscale wires for selecting a specific subset of the nanoscale wires, wherein microscale inputs of the first set of microscale inputs act as addressing wires associated with the different subsets of the plurality of nanoscale wires, for selecting a nanoscale wire among the specific subset of nanoscale wires once the specific subset has been selected.

8. An address selection method comprising:
   selecting a nanoscale wire from a plurality of nanoscale wires through a first set of microscale inputs;
   associating a code to the selected nanoscale wire through a second set of microscale inputs;
   repeating the selecting and associating steps in accordance with a number of addresses to be programmed;
   associating addresses to codes associated with the selected nanoscale wires; and
   selecting an address among the associated addresses by means of the second set of microscale inputs.

9. The method of claim 8, wherein the addresses are memory addresses.

10. The method of claim 8, wherein the plurality of nanoscale wires are stochastically assembled.

11. The method of claim 8, wherein selecting a nanoscale wire from a plurality of nanoscale wires through a first set of microscale inputs comprises providing microscale ohmic contacts, each ohmic contact connected to a different subset of the plurality of nanoscale wires for selecting a specific subset of the nanoscale wires, wherein microscale inputs of the first set of microscale inputs act as addressing wires associated with the different subsets of the plurality of nanoscale wires, for selecting a nanoscale wire among the specific subset of nanoscale wires once the specific subset has been selected.

12. A memory addressing system comprising:
   a first stochastically assembled row decoder to select a first set of nanoscale wires through a first set of microscale inputs;
   a programmable row decoder to associate row addresses to the selected first set of nanoscale wires through a second set of microscale inputs;
   a first stochastically assembled column decoder to select a second set of nanoscale wires through a third set of microscale inputs; and
   a programmable column decoder to associate column addresses to the selected second set of nanoscale wires through a fourth set of microscale inputs.

13. The memory addressing system of claim 12, wherein the programmable row decoder and the programmable column decoder associate unusable codes to defective nanoscale wires.

14. The memory addressing system of claim 12, wherein the first row decoder and the first column decoder further test whether a nanoscale wire is functional or defective.

15. The memory addressing system of claim 12, wherein at least one among the programmable row decoder and the programmable column decoder comprises one-time programmable field effect nanoscale junctions.

16. The memory addressing system of claim 12, wherein at least one among the programmable row decoder and the programmable column decoder comprises re-programmable field effect nanoscale junctions.

17. The memory addressing system of claim 12, wherein at least one among the programmable row decoder and the programmable column decoder comprises programmable diode nanoscale junctions.

18. The memory addressing system of claim 12, wherein:
   inputs from the second set of microscale inputs are sent to a second row decoder, the second row decoder selecting row inputs to and from the memory through a third set of nanoscale wires; and inputs from the third set of microscale inputs are sent to a second column decoder, the second column decoder selecting column inputs to and from the memory through a fourth set of nanoscale wires.

19. The memory addressing system of claim 12, wherein output nanoscale wires from at least one between the programmable row decoder and the programmable column decoder select an address on a set of selection wires, the set of selection wires selectively enabling conduction along a subset of wires in a third set of nanoscale wires.

20. The memory addressing system of claim 19, wherein the third set of nanoscale wires are stochastically assembled.

21. The memory addressing system of claim 19, wherein the third set of nanoscale wires comprise axially distributed controllable regions.

22. The memory addressing system of claim 19, wherein the set of selection wires are nanoscale wires.

23. The memory addressing system of claim 19, wherein the subset of nanoscale wires on which conduction is selectively enabled by the selection wires comprises one nanoscale wire at a time.

24. The memory addressing system of claim 19, further comprising programmable crosspoints to allow selection of the address on the set of selection wires.

25. The memory addressing system of claim 24, wherein the programmable crosspoints are diodes.

26. The memory addressing system of claim 18, wherein at least one among the programmable row decoder and the programmable column decoder comprises programmable diode junctions, the programmable diode junctions forming a translation memory.

27. The memory addressing system of claim 12, further comprising unassigned nanoscale wires to take into account faults in the nanoscale wires.

28. The memory addressing system of claim 12, wherein nanoscale wires which are defective with reference to a particular address are taken into consideration to be assigned to a different address.

29. The memory addressing system of claim 12, further comprising microscale ohmic contacts, each ohmic contact connected to a different subset of nanoscale wires for selecting a specific subset of the nanoscale wires, wherein microscale inputs of the first set of microscale inputs act as addressing wires associated with the different subsets of nanoscale wires, for selecting a nanoscale wire among the specific subset of the nanoscale wires once the specific subset has been selected.

30. A decoder for addressing a nanoscale memory comprising:

a plurality of nanoscale wires, each nanoscale wire of the plurality of nanoscale wires corresponding to a nanoscale row or a nanoscale column of the nanoscale memory, wherein the nanoscale wires of the plurality of nanoscale wires comprise axially distributed controllable regions; and a plurality of selection wires intersecting the nanoscale wires, the selection wires adapted to select a nanoscale wire among the plurality of nanoscale wires, thus selecting a nanoscale row or a nanoscale column of the nanoscale memory.

31. The decoder of claim 30, wherein nanoscale wires of the plurality of nanoscale wires are stochastically assembled.

32. The decoder of claim 30, wherein the selection wires are microscale wires.

33. The decoder of claim 30, wherein the selection wires are nanoscale wires.

34. The decoder of claim 30, further comprising a separation layer between the plurality of nanoscale wires and the plurality of selection wires.

35. The decoder of claim 30, further comprising a microscale input to isolate a voltage supply from the nanoscale wires.

36. A decoder for addressing a nanoscale memory comprising:

a plurality of nanoscale wires, each nanoscale wire of the plurality of nanoscale wires corresponding to a nanoscale row or a nanoscale column of the nanoscale memory;

a plurality of selection wires intersecting the nanoscale wires, the selection wires adapted to select a nanoscale wire among the plurality of nanoscale wires, thus selecting a nanoscale row or a nanoscale column of the nanoscale memory; and a separation layer between the plurality of nanoscale wires and the plurality of selection wires.

37. A decoder for addressing a nanoscale memory comprising:

a plurality of nanoscale wires, each nanoscale wire of the plurality of nanoscale wires corresponding to a nanoscale row or a nanoscale column of the nanoscale memory;

a plurality of selection wires intersecting the nanoscale wires, the selection wires adapted to select a nanoscale wire among the plurality of nanoscale wires, thus selecting a nanoscale row or a nanoscale column of the nanoscale memory; and a microscale input to isolate a voltage supply from the nanoscale wires.

* * * * *